United States Patent
Kim et al.

(10) Patent No.: US 9,806,231 B2
(45) Date of Patent: Oct. 31, 2017

(54) SEMICONDUCTOR LIGHT-EMITTING DEVICE HAVING A PHOTONIC CRYSTAL PATTERN FORMED THEREON, AND METHOD FOR MANUFACTURING SAME

(71) Applicant: INTELLECTUAL DISCOVERY CO., LTD., Seoul (KR)

(72) Inventors: Taegeun Kim, Seongnam-si (KR); Homyoung An, Seoul (KR); Jaein Sim, Seoul (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 25 days.

(21) Appl. No.: 14/994,246

(22) Filed: Jan. 13, 2016

(65) Prior Publication Data

US 2016/0126418 A1 May 5, 2016

Related U.S. Application Data

(62) Division of application No. 13/818,669, filed as application No. PCT/KR2011/006033 on Aug. 17, 2011, now abandoned.

(30) Foreign Application Priority Data

Aug. 23, 2010 (KR) .......................... 10-2010-0081625

(51) Int. Cl.
*H01L 21/00* (2006.01)
*H01L 33/24* (2010.01)
(Continued)

(52) U.S. Cl.
CPC .......... *H01L 33/24* (2013.01); *H01L 33/0095* (2013.01); *H01L 33/22* (2013.01);
(Continued)

(58) Field of Classification Search
CPC ................................ H01L 33/02; H01L 33/22
See application file for complete search history.

(56) References Cited

U.S. PATENT DOCUMENTS

2008/0035953 A1 2/2008 Beom et al.

FOREIGN PATENT DOCUMENTS

| JP | 2008-085372 A | 4/2008 |
| JP | 2008-159894 A | 7/2008 |

(Continued)

OTHER PUBLICATIONS

International Search Report of International Application No. PCT/KR2011/006033, dated Mar. 28, 2012.

*Primary Examiner* — Samuel Gebremariam (57) ABSTRACT

The present invention relates to a semiconductor light-emitting device having a two-stage photonic crystal pattern formed thereon, and to a method for manufacturing same. According to the present invention, a second photonic crystal pattern is formed inside a first photonic crystal pattern formed on a semiconductor layer or transparent electrode layer, in order to improve light extraction efficiency. Also, according to the present invention, in order to form a second fine nanoscale photonic crystal pattern in the first photonic crystal pattern, a nanosphere lithography process employing polymer beads is used, and a trapping layer made of a thermoplastic resin was used to conveniently form polymer beads in a single layer so as to eliminate the inconvenience of having to calculate and change process variables according to polymer bead sizes in traditional nanosphere lithography processes.

8 Claims, 8 Drawing Sheets

(51) Int. Cl.
    *H01L 33/22*     (2010.01)
    *H01L 33/36*     (2010.01)
    *H01L 33/58*     (2010.01)
    *H01L 33/00*     (2010.01)
    *H01L 33/32*     (2010.01)
    *H01L 33/42*     (2010.01)

(52) U.S. Cl.
    CPC .............. *H01L 33/32* (2013.01); *H01L 33/36* (2013.01); *H01L 33/42* (2013.01); *H01L 33/58* (2013.01); *H01L 2933/0083* (2013.01); *H01L 2933/0091* (2013.01)

(56) References Cited

FOREIGN PATENT DOCUMENTS

| | | |
|---|---|---|
| KR | 10-2005-0072640 A | 7/2005 |
| KR | 10-0780233 B1 | 11/2007 |
| KR | 10-0816841 B1 | 3/2008 |
| KR | 10-2008-0093558 A | 10/2008 |

SEMICONDUCTOR LIGHT-EMITTING DEVICE HAVING A PHOTONIC CRYSTAL PATTERN FORMED THEREON, AND METHOD FOR MANUFACTURING SAME

CROSS-REFERENCE TO RELATED APPLICATIONS

This is a Divisional Application of U.S. patent application Ser. No. 13/818,669, filed Feb. 23, 2013, which is a §371 National Stage Application of PCT/KR2011/006033 filed Aug. 17, 2011, which claims priority from Korean Patent Application No. 10-2010-0081625 filed Aug. 23, 2010. The entire disclosures of the prior applications are considered part of the disclosure of the accompanying Divisional Application, and are hereby incorporated by reference.

TECHNICAL FIELD

The present invention relates to a semiconductor light-emitting device, and more particularly, to a semiconductor light-emitting device having a two-stage photonic crystal pattern formed thereon, so as to improve light extraction efficiency.

BACKGROUND ART

The conventional gallium nitride-based light emitting diode (LED) has very low light extraction efficiency, because only about 4% of light proceeding to an air layer from the gallium nitride-based LED is extracted due to Fresnel reflection resulting from a refraction difference between a semiconductor and an air layer, and due to a total reflectivity by the law of refraction known as Snell's law.

Figure 1:
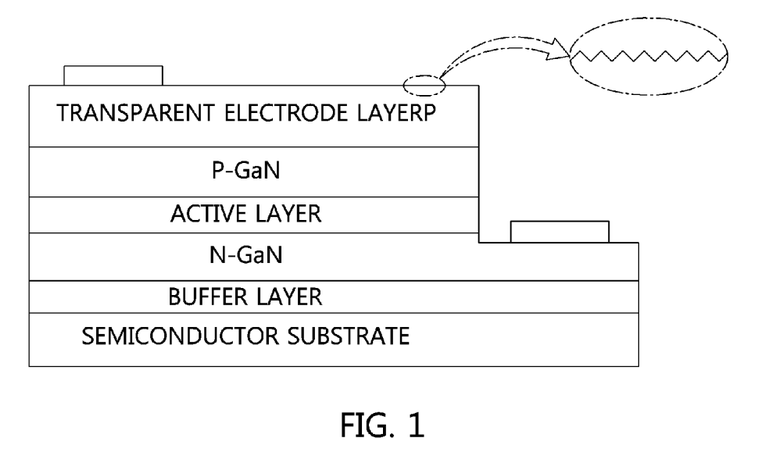
FIG. 1 is a view showing an example to form a fine pattern on the surface of a transparent electrode layer, in order to enhance light extraction efficiency of a light emitting diode (LED) in accordance with the conventional art.

In order to improve the low light extraction efficiency, research is being actively ongoing. As a representative method, a concavo-convex structure or a fine pattern is formed on the surface of the gallium nitride-based LED, thereby improving light extraction efficiency through a surface scattering effect or a two-dimensional (2D) photonic crystal effect. FIG. 1 is a view illustrating an example that a fine pattern is formed on the surface of a transparent electrode layer so as to improve light extraction efficiency of an LED in accordance with the conventional art.

Recent LED processes are being performed as fine nanoscale processes. As a lithography method for forming a fine pattern applicable to the fine nanoscale processes, mainly used are a holographic lithography, an electron-beam lithography, and a nanosphere lithography (NSL). However, in case of the hololithography, it is difficult to form a nanoscale pattern having a size of several tens of nanometers. And, the electron-beam lithography has a limitation in being applicable to patterning for a large area.

When compared with the hololithography and electron-beam lithography techniques, the nanosphere lithography has an advantage that the number of processes including PR coating, exposure, development, etc. can be reduced, because it does not require an additional mask when forming a nanoscale pattern. Further, polymer or silica-based beads used in the nanosphere lithography have various sizes of 30 nm~200 μm. This can implement various patterns of various sizes including a fine nanoscale pattern.

However, the nanosphere lithography also has the following problems. Among lithography processes using such nano-sized beads, the most important process is to coat beads in a monolayer. In order to coat polymer beads in a monolayer, various process variables such as a bead weight (wt %), a spin speed, and a surfactant amount for contact with a substrate, should be calculated and changed according to the size of the polymer beads.

DISCLOSURE OF THE INVENTION

Therefore, an object of the present invention is to provide a semiconductor light-emitting device capable of improving light extraction efficiency by forming a two-stage photonic crystal pattern on a semiconductor layer or a transparent electrode layer, and a method for manufacturing the same.

Another object of the present invention is to provide a semiconductor light-emitting device capable of effectively extracting light by forming a second fine nanoscale photonic crystal pattern in a first photonic crystal pattern, sequentially using a hololithography and a nanosphere lithography when forming a two-stage photonic crystal pattern, and a method for manufacturing the same.

Still another object of the present invention is to provide a semiconductor light-emitting device capable of simply performing a reproductive monolayer coating despite change of polymer beads, using a trapping layer when applying a nanosphere lithography, and a method for manufacturing the same.

To achieve these and other advantages and in accordance with the purpose of the present invention, as embodied and broadly described herein, there is provided a semiconductor light-emitting device, comprising: a semiconductor substrate; a first semiconductor layer formed on the semiconductor substrate; an active layer formed on the first semiconductor layer, and configured to generate light; a second semiconductor layer formed on the active layer, having a first photonic crystal pattern formed thereon, and having a second photonic crystal pattern formed in the first photonic crystal pattern; and a transparent electrode layer formed on the second semiconductor layer.

According to another aspect of the present invention, there is provided a semiconductor light-emitting device, comprising: a semiconductor substrate; a first semiconductor layer formed on the semiconductor substrate; an active layer formed on the first semiconductor layer, and configured to generate light; a second semiconductor layer formed on the active layer; and a transparent electrode layer formed on the second semiconductor layer, having a first photonic crystal pattern formed thereon, and having a second photonic crystal pattern formed in the first photonic crystal pattern.

In the semiconductor light-emitting device, the first photonic crystal pattern may have a concavo-convex section configured as an upper surface and a concaved portion, and the second photonic crystal pattern may have a concavo-convex section and may be formed on the upper surface and a lower surface of the concaved portion, respectively.

The second photonic crystal pattern may have a concavo-convex section, by a plurality of protrusions having a cylindrical shape and bottom surfaces, each bottom surface formed between the protrusions.

The concaved portion of the first photonic crystal pattern may have a quadrangular plane.

To achieve these and other advantages and in accordance with the purpose of the present invention, as embodied and broadly described herein, there is also provided a method for manufacturing a semiconductor light-emitting device, comprising: (a) sequentially forming, on a semiconductor substrate, a first semiconductor layer, an active layer and a second semiconductor layer; (b) forming, on the surface of the second semiconductor layer, a first photonic crystal pattern so as to have a concavo-convex section, and forming a second photonic crystal pattern in the first photonic crystal pattern; and (c) forming a transparent electrode layer on the second semiconductor layer.

The step (b) may include (b1) forming a plurality of concave portions on the surface of the second semiconductor layer, thereby forming the first photonic crystal pattern; and (b2) forming a second photonic crystal pattern having a concavo-convex section on an upper surface of the second semiconductor layer between the concaved portions, and on a lower surface between the concaved portions, respectively.

In step (b2), polymer beads may be arranged in a single layer, on the upper surface of the second semiconductor layer where the first photonic crystal pattern has been formed, and on the lower surface of the concaved portions. Then, the size of the polymer beads may be controlled. Then, the second semiconductor layer may be etched using the polymer beads as an etching mask, thereby forming the second photonic crystal pattern.

The step (b2) may include (b2-1) forming a trapping layer, on the surface of the second semiconductor layer where the first photonic crystal pattern has been formed; (b2-2) arranging the polymer beads on the trapping layer; (b2-3) melting the trapping layer by applying heat to the semiconductor substrate, and immersing the polymer beads positioned on the trapping layer into the melted trapping layer; (b2-4) cooling the semiconductor substrate thereby solidifying the trapping layer in a state where the polymer beads have been immersed in the trapping layer, and removing the polymer beads positioned on the trapping layer, thereby arranging the polymer beads on the second semiconductor layer in a single layer; and (b2-5) removing the trapping layer, controlling the size of the polymer beads, and etching the second semiconductor layer using the size-controlled polymer beads as an etching mask, thereby forming the second photonic crystal pattern.

According to another aspect of the present invention, there is provided a method for manufacturing a semiconductor light-emitting device, comprising: (a) sequentially forming, on a semiconductor substrate, a first semiconductor layer, an active layer, a second semiconductor layer, and a transparent electrode layer; and (b) forming, on the surface of the transparent electrode layer, a first photonic crystal pattern so as to have a concavo-convex section, and forming a second photonic crystal pattern in the first photonic crystal pattern.

The step (b) may include (b1) forming a plurality of concaved portions on the surface of the transparent electrode layer, thereby forming the first photonic crystal pattern; and (b2) forming a second photonic crystal pattern having a concavo-convex section on an upper surface of the transparent electrode layer between the concaved portions, and on a lower surface of the concaved portions, respectively.

In step (b2), polymer beads may be arranged in a single layer, on the upper surface of the transparent electrode layer where the first photonic crystal pattern has been formed, and on the lower surface of the concaved portions. Then, the size of the polymer beads may be controlled. Then, the transparent electrode layer may be etched using the polymer beads as an etching mask, thereby forming the second photonic crystal pattern.

The step (b2) may include (b2-1) forming a trapping layer, on the surface of the transparent electrode layer where the first photonic crystal pattern has been formed; (b2-2) arranging the polymer beads on the trapping layer; (b2-3) melting the trapping layer by applying heat to the semiconductor substrate, and immersing the polymer beads positioned on the trapping layer into the melted trapping layer; (b2-4) cooling the semiconductor substrate thereby solidifying the trapping layer in a state where the polymer beads have been immersed in the trapping layer, and removing the polymer beads positioned on the trapping layer, thereby arranging the polymer beads on the transparent electrode layer in a single layer; and (b2-5) removing the trapping layer, controlling the size of the polymer beads, and etching the transparent electrode layer using the size-controlled polymer beads as an etching mask, thereby forming the second photonic crystal pattern.

The trapping layer may be formed of a thermoplastic resin.

In step (b2-1), the trapping layer may be preferably formed such that the thickness thereof is smaller than the diameter of the polymer beads.

The present invention may have the following advantages.

Firstly, the second photonic crystal pattern is formed inside the first photonic crystal pattern formed on the semiconductor layer or the transparent electrode layer, in order to improve light extraction efficiency.

Secondly, in order to form the second fine nanoscale photonic crystal pattern in the first photonic crystal pattern, a nanosphere lithography process employing polymer beads is used, and the trapping layer made of a thermoplastic resin was used to conveniently form polymer beads in a single layer so as to eliminate the inconvenience of having to calculate and change process variables according to polymer bead sizes in conventional nanosphere lithography processes.

MODES FOR CARRYING OUT THE PREFERRED EMBODIMENTS

Reference will now be made in detail to the preferred embodiments of the present invention, examples of which are illustrated in the accompanying drawings. It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

Figure 2:
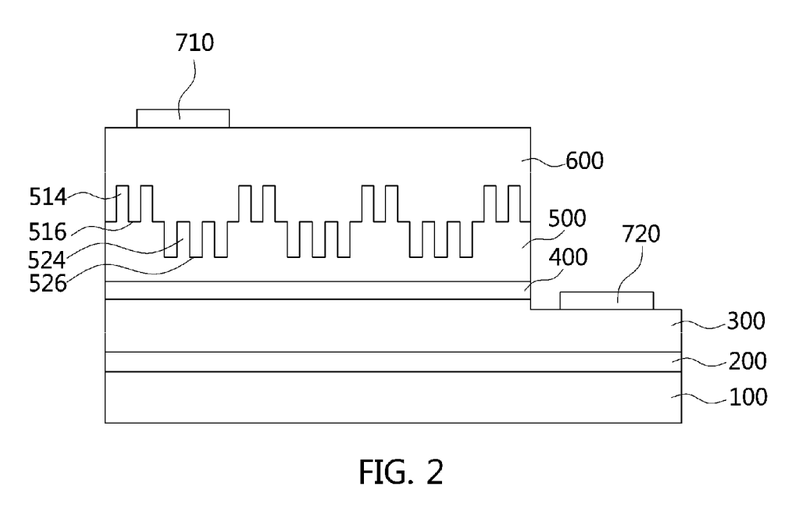
FIG. 2 is a view showing a light-emitting device according to a preferred embodiment of the present invention.

FIG. 2 is a view showing a semiconductor light-emitting device according to a preferred embodiment of the present invention. FIG. 2 illustrates a horizontal type light-emitting device. However, the present invention may be also applicable to a vertical type light-emitting device.

Referring to FIG. 2, like the conventional semiconductor light-emitting device, the semiconductor light-emitting device according to a preferred embodiment of the present invention includes a semiconductor substrate 100, a buffer layer 200, a first semiconductor layer 300, an active layer 400, a second semiconductor layer 500, and a transparent electrode layer 600 formed on the semiconductor substrate 100, sequentially. A two-stage photonic pattern is formed on an upper surface 510 of the semiconductor layer 500 contacting the transparent electrode layer 600.

In an embodiment of the present invention, the first semiconductor layer 300 is implemented as an 'n'-type semiconductor layer, and the second semiconductor layer 500 is implemented as a 'p'-type semiconductor layer. However, the first semiconductor layer 300 may be formed as a 'p'-type semiconductor layer, and the second semiconductor layer 500 may be formed as an 'n'-type semiconductor layer.

The semiconductor substrate 100, the buffer layer 200, the first semiconductor layer 300, the active layer 400, and the second semiconductor layer 500 may have the same configurations as those of a general horizontal type light-emitting device, and thus detailed explanations thereof will be omitted. Rather, only the feature of the present invention, a photonic crystal pattern will be explained.

Figure 3A:
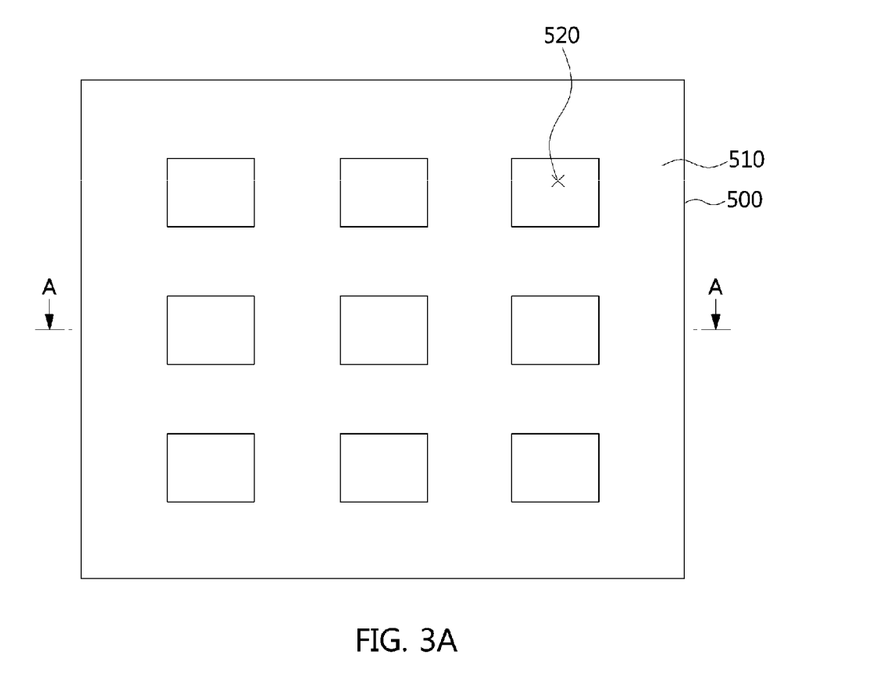
FIGS. 3A to 3C are views showing a structure of a photonic crystal pattern according to an embodiment of the present invention.
Figure 3B:
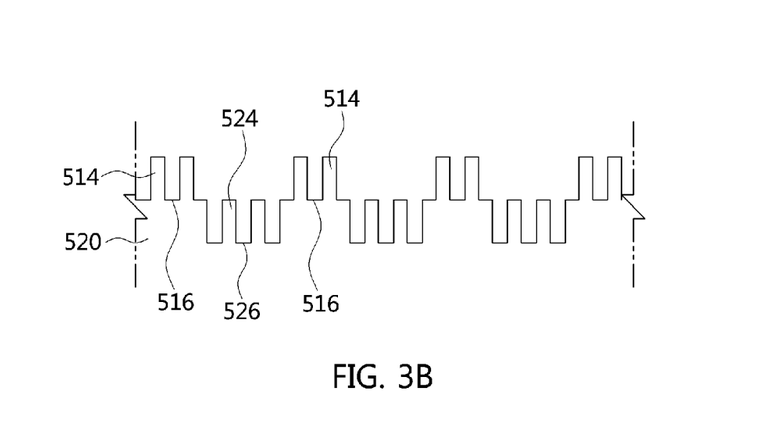
Figure 3C:
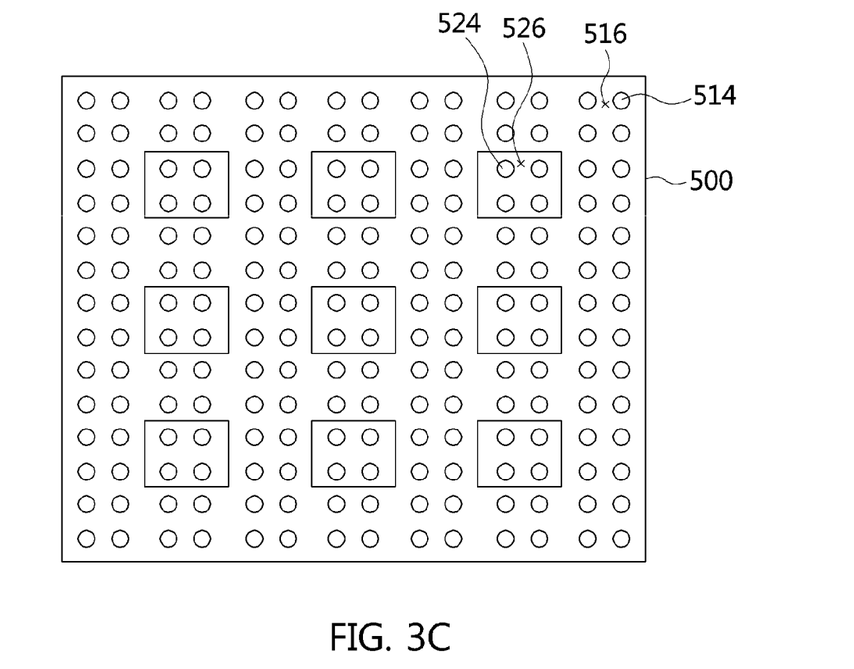

FIGS. 3A to 3C are views showing a structure of a photonic crystal pattern according to an embodiment of the present invention. FIG. 3A is a planar view of the second semiconductor layer 500 having a first photonic crystal pattern formed thereon. FIG. 3B is a sectional view of the second semiconductor layer 500 having first and second photonic crystal patterns formed thereon. And, FIG. 3C is a FIG. 3B is a planar view of the second semiconductor layer 500 having first and second photonic crystal patterns formed thereon.

Referring to FIG. 3a, a plurality of concaved portions 520 are formed on the surface of the second semiconductor layer 500, so that a first photonic crystal pattern having a concavo-convex section (A-A') is formed on the surface of the second semiconductor layer 500. The width of the concaved portions 520 of the first photonic crystal pattern is formed in several micrometer size. And, the number and the size of the concaved portions 520 formed on the second semiconductor layer 500 may be controllable. Hereinafter, the surface of the second semiconductor layer 500 will be called an 'upper surface' 510, and the bottom surface of the concaved portions 520 formed toward the inside of the second semiconductor layer 500 from the upper surface 510 will be called a 'lower surface' 522.

In FIG. 3A, the concaved portions 520 has a quadrangular planar shape. However, the concaved portions 520 may have various planar shapes. Further, it should be noted that only a first photonic crystal pattern rather than a second photonic crystal pattern was illustrated in FIG. 3A for convenience.

Referring to FIGS. 3B and 3C, a second photonic crystal pattern consisting of protrusion 514 and 524 and bottom surfaces 516 and 526 lower than the protrusions 514 and 524, are formed on the upper surface 510 and the lower surface 522 of the second semiconductor layer 500, respectively. Since the second photonic crystal pattern having a concavo-convex section is respectively formed on the upper surface 510 and the lower surface 522 of the second semiconductor layer 500, the second semiconductor layer 500 entirely has a two-stage photonic crystal pattern. The width of the protrusions 514 and 524 formed on the upper surface 510 and the lower surface 522, respectively has a nanometer size, and the interval between the protrusions 514 and 524 also has a nanometer size.

As the two-stage photonic crystal pattern is formed on the second semiconductor layer 500, light extraction efficiency can be more improved than in the conventional art.

In the aforementioned embodiment, the two-stage photonic crystal pattern was formed on the second semiconductor layer 500. However, in a modification embodiment of the present invention, the two-stage photonic crystal pattern was formed on a transparent electrode layer 600.

FIGS. 4A to 4I are views showing manufacturing processes of a semiconductor light-emitting device having a two-stage photonic crystal pattern formed thereon, according to an embodiment of the present invention. Hereinafter, with reference to FIGS. 4A to 4I, will be explained a method for manufacturing a semiconductor light-emitting device having a two-stage photonic crystal pattern formed thereon, according to an embodiment of the present invention.

Figure 4A:
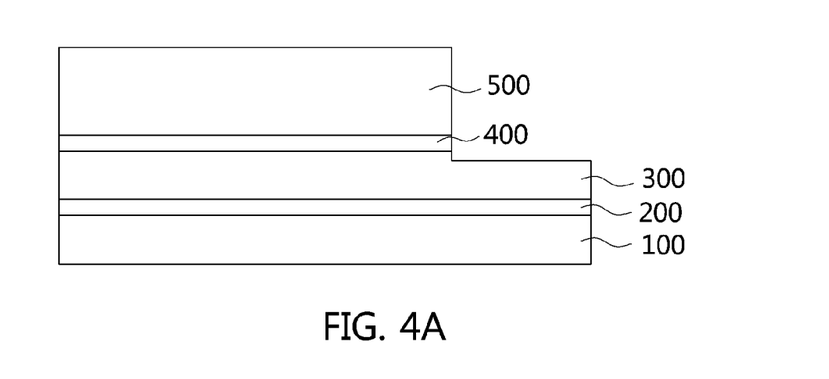
FIGS. 4A to 4I are views showing manufacturing processes of a semiconductor light-emitting device having a two-stage photonic crystal pattern formed thereon, according to an embodiment of the present invention.

As shown in FIG. 4A, a buffer layer 200, a first semiconductor layer 300, an active layer 400, and a second semiconductor layer 500 are sequentially formed on a semiconductor substrate 100, in the same manner as the conventional art.

Figure 4B:
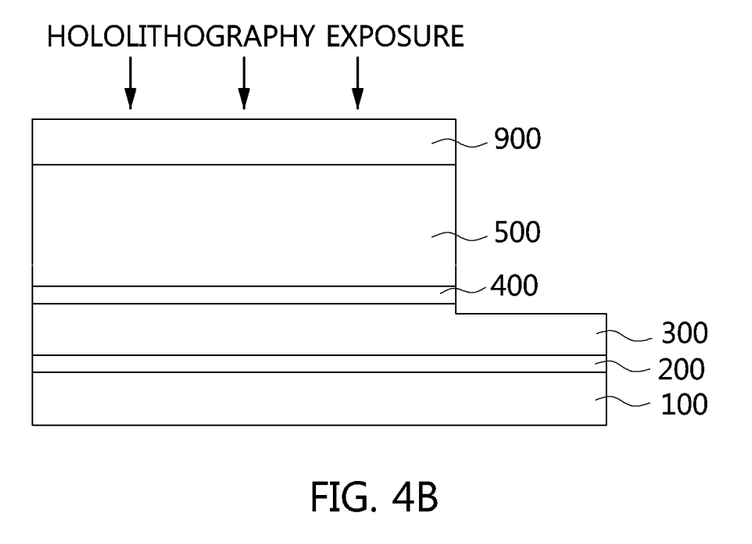
Figure 4C:
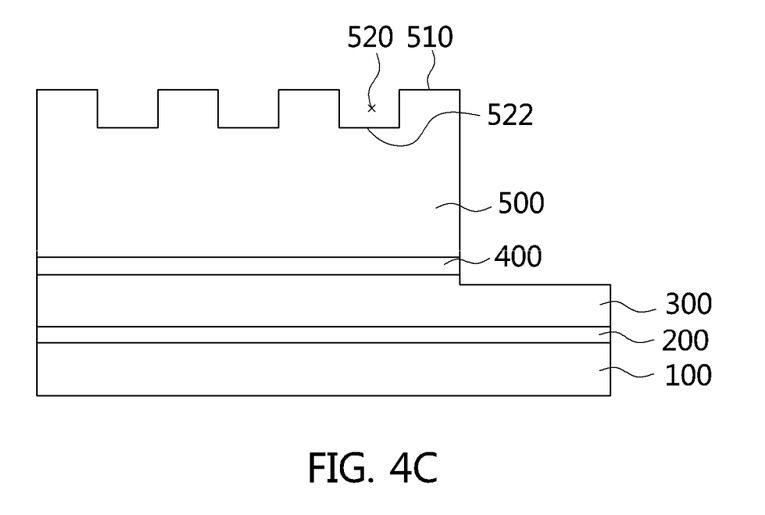

As shown in FIG. 4B, a photoresist 900 is formed on the second semiconductor layer 500, and then exposed to be developed by a hololithography exposure technique, thereby being prepared as a photolithography mask. As shown in FIG. 4C, the second semiconductor layer 500 is etched using the remaining photoresist 900 as an etching mask, thereby forming a plurality of concaved portions 520 on the second semiconductor layer 500. Then, the remaining photoresist 900 is removed to form a first photonic crystal pattern on the second semiconductor layer 500.

Figure 4D:
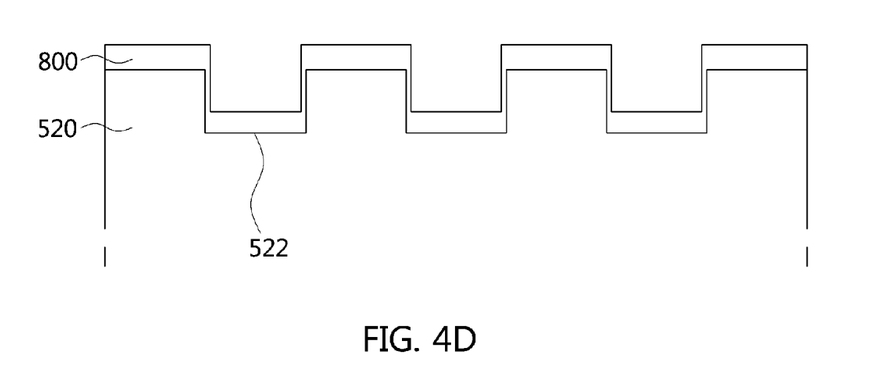

As shown in FIG. 4D, a trapping layer 800 formed of a polymer-based thermoplastic material well-melted by applied heat, is formed on the second semiconductor layer 500. Here, the thickness of the trapping layer should be smaller than the diameter of polymer beads 1000. Preferably, the thickness of the trapping layer should be designed so that the melted trapping layer 800 cannot exceed the polymer beads 1000, when the polymer beads 1000 are immersed in the melted trapping layer 800 by sequent processes.

Figure 4E:
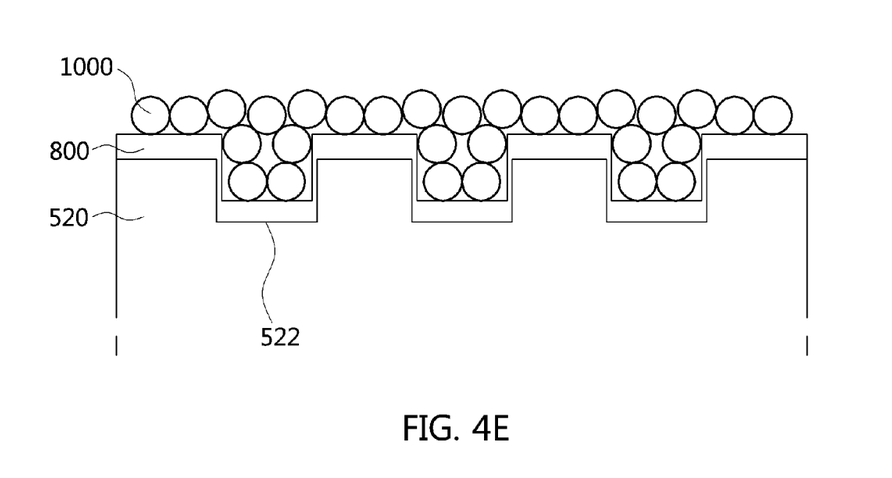

After the trapping layer 800 is formed, as shown in FIG. 4E, the polymer beads 1000 are coated on the second semiconductor layer 500 having the trapping layer 800 formed thereon. Here, the polymer beads 1000 may be coated in various manners. For instance, a solution containing the polymer beads 1000 is coated, by a sol-gel method, onto the second semiconductor layer 500 having the trapping layer 800 formed thereon. Then, a solvent is evaporated to coat the polymer beads 1000 in multi layers.

Figure 4F:
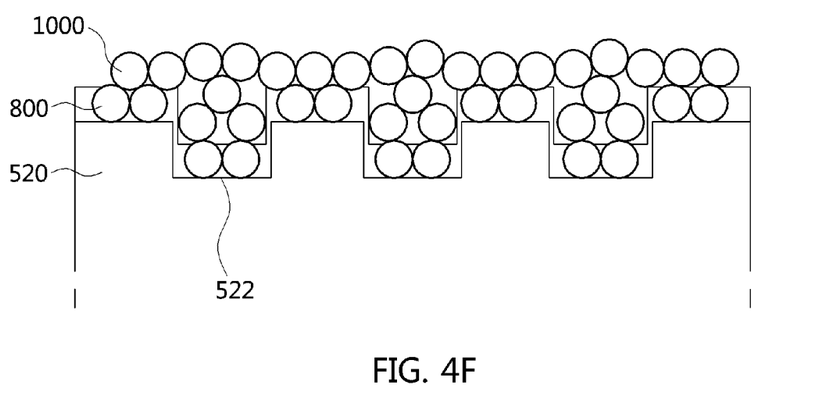

After the second semiconductor layer 500 is coated with the polymer beads 1000, heat having a proper temperature where the trapping layer 800 can be melted (about 100☐ in the preferred embodiment of the present invention) is applied to the semiconductor substrate 100. As a result, as shown in FIG. 4F, the polymer beads 1000 positioned on the trapping layer 800 start to be immersed into the trapping layer 800 while the trapping layer 800 is melted. If the semiconductor substrate 100 is cooled, the melted trapping layer 800 is solidified. As a result, the polymer beads 1000 immersed in the trapping layer 800 are accommodated in the trapping layer 800.

Figure 4G:
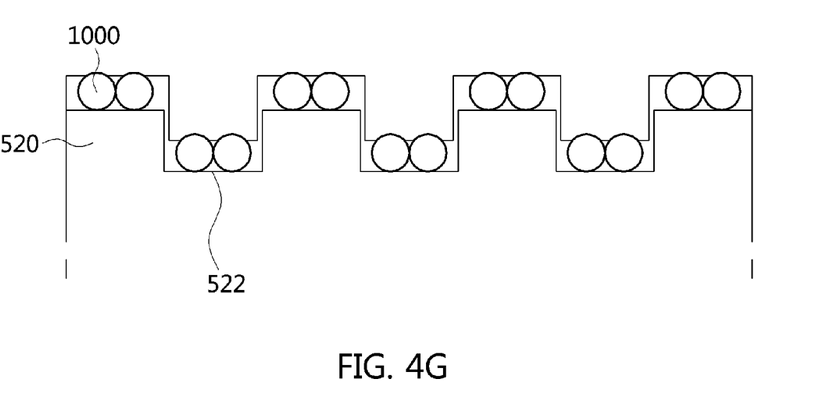

As shown in FIG. 4G, if the polymer beads 1000 not accommodated in the trapping layer 800 are removed by performing a rinsing process using ultra pure de-ionized water (at a temperature of about 40□ for about 15 minutes), the polymer beads 1000 are arranged in a single layer, on the upper surface 510 of the second semiconductor layer 500 and on the lower surface 522 of the concaved portions 520, the upper surface 510 and the lower surface 522 which constitute a first photonic crystal pattern.

Figure 4H:
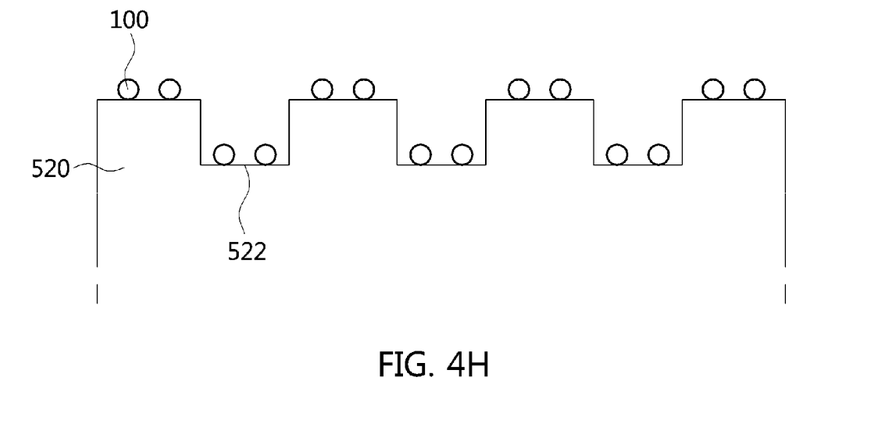

Once the single layer of the polymer beads 1000 is disposed on the second semiconductor layer 500, as shown in FIG. 4H, the trapping layer 800 is removed by an O2 RIE (Reactive Ion Etching) process. Then, the polymer beads 1000 are etched by a CF4 RIE process, to thus have a reduced size. Then, the polymer beads 1000 having a reduced size are used as an etching mask, thereby determining the size (width) of the protrusions 514 and 524 of the second photonic crystal pattern formed in the first photonic crystal pattern, and the interval between the protrusions 514 and 524.

Figure 4I:
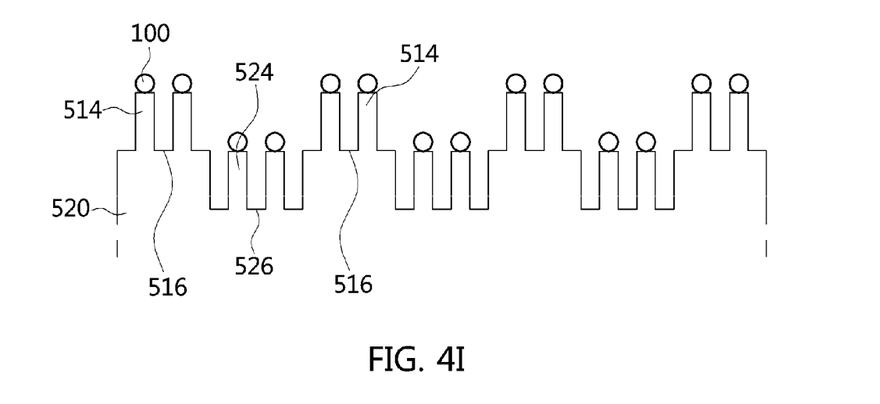

After the polymer beads 1000 are etched in correspondence to the second photonic crystal pattern, as shown in FIG. 4I, the second semiconductor layer 500 is etched by a deep RIE (Reactive Ion Etching) process, using the polymer beads 1000 as an etching mask. Upon completion of the etching, the second photonic crystal pattern having a concavo-convex section is respectively formed on the upper surface 510 of the first photonic crystal pattern having a concavo-convex section, and on the lower surface 522 of the concaved portions 520. The polymer beads 1000 used to form the second photonic crystal pattern are spherical. Accordingly, once the second photonic crystal pattern is formed, the protrusions 514 and 524 having a cylindrical shape are formed on the upper surface 510 of the second semiconductor layer 500 and in the concaved portions 520.

Once the second photonic crystal pattern is formed on the second semiconductor layer 500, the polymer beads 1000 are removed, and then a transparent electrode layer 600 is formed on the second semiconductor layer 500. Then, electrode pads 710 and 720 are formed on the transparent electrode layer 600 and the first semiconductor layer, thereby completing the semiconductor light-emitting device of FIG. 2.

Figure 5:
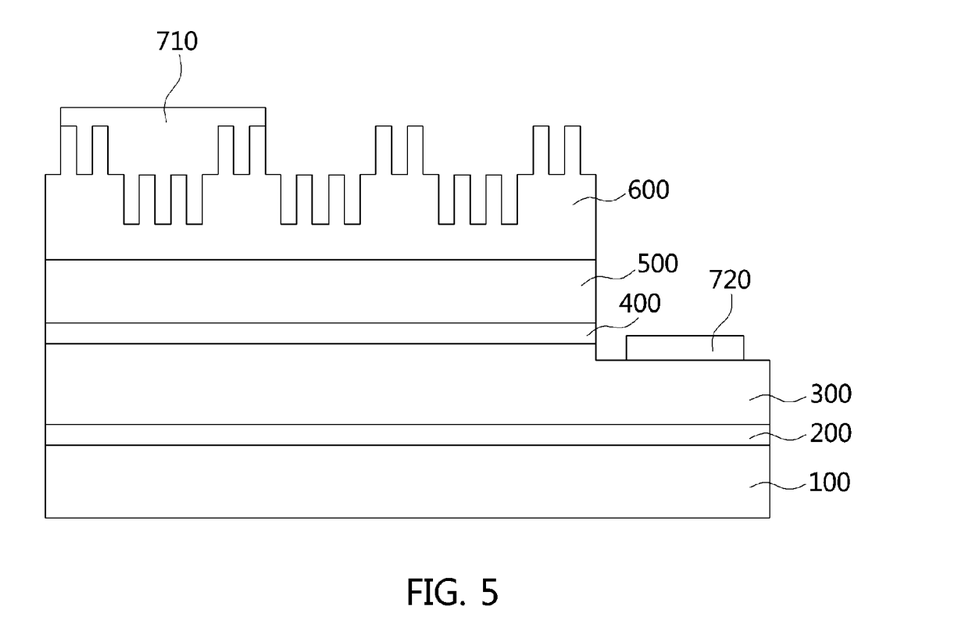
FIG. 5 is a view showing a structure of a semiconductor light-emitting device according to a modification embodiment of the present invention.

So far, explained were the semiconductor light-emitting device having a two-stage photonic crystal pattern formed thereon, and a method for manufacturing the same according to an embodiment of the present invention. In the aforementioned embodiment, a two-stage photonic crystal pattern was formed on the second semiconductor layer 500. However, in a modification embodiment, as shown in FIG. 5, the transparent electrode layer 600 is formed on the second semiconductor layer 500, and a two-stage photonic crystal pattern is formed on the transparent electrode layer 600. Then, an electrode pad 710 which fills the photonic crystal pattern is formed on a partial region of the transparent electrode layer 600. In the modification embodiment, the processes for forming the two-stage photonic crystal pattern are the same as those in the aforementioned embodiment, except that the two-stage photonic crystal pattern is formed on the transparent electrode layer 600. Therefore, detailed explanations thereof will be omitted.

What is claimed is:

1. A method for manufacturing a semiconductor light-emitting device, comprising:
   (a) sequentially forming, on a semiconductor substrate, a first semiconductor layer, an activation layer and a second semiconductor layer;
   (b) forming, on the surface of the second semiconductor layer, a first photonic crystal pattern so as to have a concavo-convex section, and forming a second photonic crystal pattern in the first photonic crystal pattern; and
   (c) forming a transparent electrode layer on the second semiconductor layer,
   wherein the step (b) comprises:
      (b1) forming a plurality of concave portions on the surface of the second semiconductor layer, thereby forming the first photonic crystal pattern; and
      (b2) forming the second photonic crystal pattern having a concavo-convex section on an upper surface of the second semiconductor layer between the concaved portions, and on a lower surface of the concaved portions, respectively, and
   wherein in the step (b2), polymer beads are arranged in a single layer on the upper surface of the semiconductor layer where the first photonic crystal pattern has been formed, and on the lower surface of the concaved portions, then a size of the polymer beads is controlled, and then the second semiconductor layer is etched using the polymer beads as an etching mask, thereby forming the second photonic crystal pattern.

2. The method of claim 1, wherein the step (b2) comprises:
   (b2-1) forming a trapping layer, on the surface of the second semiconductor layer where the first photonic crystal pattern has been formed;
   (b2-2) arranging the polymer beads on the trapping layer;
   (b2-3) melting the trapping layer by applying heat to the semiconductor substrate, and immersing the polymer beads positioned on the trapping layer into the melted trapping layer;
   (b2-4) cooling the semiconductor substrate thereby solidifying the trapping layer in a state where the polymer beads have been immersed in the trapping layer, and removing the polymer beads positioned on the trapping layer, thereby arranging the polymer beads on the second semiconductor layer in a single layer; and
   (b2-5) removing the trapping layer, controlling the size of the polymer beads, and etching the second semiconductor layer using the size-controlled polymer beads as an etching mask, thereby forming the second photonic crystal pattern.

3. The method of claim 2, wherein the trapping layer is formed of a thermoplastic resin.

4. The method of claim 2, wherein in the step (b2-1), the trapping layer is formed such that the thickness thereof is smaller than the diameter of the polymer beads.

5. A method for manufacturing a semiconductor light-emitting device, comprising:
   (a) sequentially forming, on a semiconductor substrate, a first semiconductor layer, an activation layer, a second semiconductor layer, and a transparent electrode layer; and
   (b) forming, on the surface of the transparent electrode layer, a first photonic crystal pattern so as to have a concavo-convex section, and forming a second photonic crystal pattern in the first photonic crystal pattern,
   wherein the step (b) comprises:
      (b1) forming a plurality of concaved portions on the surface of the transparent electrode layer, thereby forming the first photonic crystal pattern; and
      (b2) forming the second photonic crystal pattern having a concavo-convex section on an upper surface of the transparent electrode layer between the concaved portions, and on a lower surface of the concaved portions, respectively, and wherein in the step (b2), polymer beads are arranged in a single layer on the upper surface of the transparent electrode layer where the first photonic crystal pattern has been formed, and on the lower surface of the concaved portions, then a site of the polymer beads is controlled, and then the transparent electrode layer is etched using the polymer beads as an etching mask, thereby forming the second photonic crystal pattern.

6. The method of claim 5, wherein the step (b2) comprises:
(b2-1) forming a trapping layer, on the surface of the transparent electrode layer where the first photonic crystal pattern has been formed;
(b2-2) arranging the polymer beads on the trapping layer;
(b2-3) melting the trapping layer by applying heat to the semiconductor substrate, and immersing the polymer beads positioned on the trapping layer into the melted trapping layer;
(b2-4) cooling the semiconductor substrate thereby solidifying the trapping layer in a state where the polymer beads have been immersed in the trapping layer, and removing the polymer beads positioned on the trapping layer, thereby arranging the polymer beads on the transparent electrode layer in a single layer; and
(b2-5) removing the trapping layer, controlling the size of the polymer beads, and etching the transparent electrode layer using the size-controlled polymer beads as an etching mask, thereby forming the second photonic crystal pattern.

7. The method of claim 6, wherein the trapping layer is formed of a thermoplastic resin.

8. The method of claim 6, wherein in the step (b2-1), the trapping layer is formed such that the thickness thereof is smaller than the diameter of the polymer beads.

* * * * *